(12) United States Patent
Schulze

(10) Patent No.: US 6,168,978 B1
(45) Date of Patent: Jan. 2, 2001

(54) METHOD FOR PRODUCING A POWER SEMICONDUCTOR COMPONENT ON A TWO-SIDED SUBSTRATE THAT BLOCKS ON BOTH SIDES OF THE SUBSTRATE

(75) Inventor: Hans-Joachim Schulze, Ottobrunn (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/243,765

(22) Filed: Feb. 3, 1999

(30) Foreign Application Priority Data

Feb. 3, 1998 (DE) .............................. 198 04 191

(51) Int. Cl.[7] .................................. H01L 21/332
(52) U.S. Cl. ..................... 438/133; 438/455; 438/460
(58) Field of Search .................... 438/133, 134, 438/135, 137, 138, 140, 455, 458, 460 414, 420

(56) References Cited

U.S. PATENT DOCUMENTS

| | | | |
|---|---|---|---|
| 3,701,696 | * | 10/1972 | Mets . |
| 3,706,129 | * | 12/1972 | McCann . |
| 3,852,876 | * | 12/1974 | Sheldon et al. . |
| 5,072,312 | | 12/1991 | Schwarzbauer et al. . |
| 5,330,918 | * | 7/1994 | Dubbelday et al. . |
| 5,332,920 | | 7/1994 | Nakagawa et al. . |
| 5,362,659 | | 11/1994 | Cartagena . |
| 5,698,454 | | 12/1997 | Zommer . |
| 5,882,986 | * | 3/1999 | Eng et al. . |

FOREIGN PATENT DOCUMENTS

| | | |
|---|---|---|
| 0 341 075 | 11/1989 | (EP) . |
| 0 387 721 | 3/1990 | (EP) . |
| WO 96/03774 | 2/1996 | (WO) . |

OTHER PUBLICATIONS

Patent Abstracts of Japan, Japanese Application No. 60021884.
Patent Abstracts of Japan, Japanese Application No. 60021887.

* cited by examiner

Primary Examiner—Tuan H. Nguyen
(74) Attorney, Agent, or Firm—Schiff Hardin & Waite

(57) ABSTRACT

In a method for the production of a power component that blocks on both sides of a substrate, a disc of a first conductivity type is joined with a substrate of a second conductivity type, on a second side of the disc to form a wafer, a trench is produced in the first side of the disc at the edge of a power component on the wafer, a terminal region of the second conductivity type is produced on the first side of the disc, this region containing an edge termination for the reverse blocking ability of the component, and a first layer of the second conductivity type is produced on the exposed surface of the trench, so that an electrical contact is produced between the substrate and the terminal region.

18 Claims, 1 Drawing Sheet

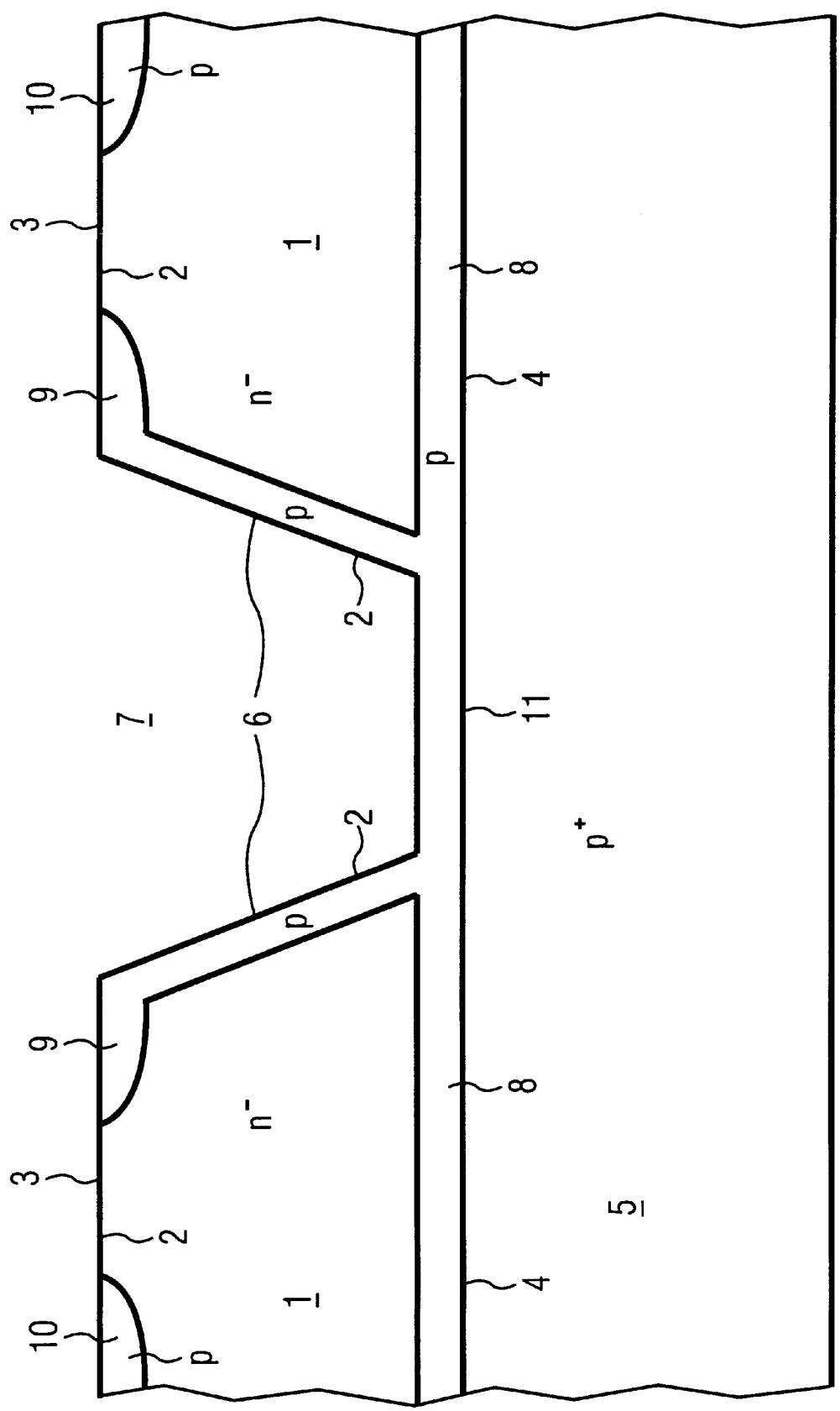

METHOD FOR PRODUCING A POWER SEMICONDUCTOR COMPONENT ON A TWO-SIDED SUBSTRATE THAT BLOCKS ON BOTH SIDES OF THE SUBSTRATE

BACKGROUND OF THE INVENTION

1. Field of the Invention

The present invention relates to a method for the production of a power component on a two-sided substrate which blocks (i.e., is switchable to a non-conducting state) on both sides of the substrate, such as a thyristor or a bipolar transistor with an insulated gate (IGBT=Insulated Gate Bipolar Transistor), of the type wherein semiconductor structures are created on a first side of the surface of a disc of a first conductivity type and the semiconductor structures have at least one trough of a second conductivity type at the surface of the disc.

2. Description of the Prior Art

In large-surface power semiconductors, such as thyristors and gate turn-off thyristors (GTOs), the reverse blocking ability is generally realized by means of mechanical processing such as oblique looping (lapping) or sand blasting (sanding) of positive or negative angles. By beveling at the edge, the surface field can be lowered considerably, and it thus can be guaranteed that a breakdown occurs inside the semiconductor rather than at its surface.

Edge beveling is not possible, however, in small components, such as an IGBT, for example, since it would be very costly and would require a change to a round chip, besides. In addition, considerably lower penetration depths of the pn-junctions are used in an IGBT, for example. To a large extent, this rules out the utilization of mechanically produced edge terminations. Planar edge terminations such as field ring structures are conventionally used for this purpose. A disadvantage of field ring structures, however, is that, in a component which blocks on both sides, an edge termination is required on each of the front side and back side of the semiconductor disc for both polarity directions. This is possible only with an expensive, double-sided photo-technique.

Isolation diffusion is one alternative, i.e., the diffusion of a separating layer into the substrate. A conductive connection between the front and back sides of the semiconductor disc can be created in the edge region with the separating layer.

Today, isolation diffusion is realized only in the form of an Al diffusion, since Al diffuses rapidly, significantly more so than boron, for example. It is disadvantageous, however, that even given the utilization of an Al diffusion, and given a relatively low disc thickness of 300 $\mu$m and a relatively high diffusion temperature of ca. 1240° C., a push-in time of at least 50 hours is required, which is associated with a very high material load. Above all, however, the application of Al diffusion in IC lines in which the production of IGBTs occurs is generally not permitted, since Al can not be masked by $SiO_2$, and cross-contaminations may arise, which can result in a degradation of the gate-oxide, among other things.

SUMMARY OF THE INVENTION

An object of the present invention is to provide a method for producing a power component that blocks on both sides of a substrate which is easy to realize and which overcomes the aforementioned disadvantages.

The inventive solution is based on the placement of all the edge terminations of the power component on the front of the component. All processing steps in the production of the component thus can be related to the front side. This enables a simplification of the production method, and thus a more cost-effective production than in known methods. Particularly, an isolation diffusion, by boron diffusion, for example, can be realized with relatively little time outlay and low temperature load by means of a trench etching in the edge region of the discs. To support the disc mechanically, the disc to be etched is secured on a carrier substrate.

The inventive method for the production of a number of vertical power components that block on both sides on a wafer includes the steps of producing semiconductor structures on a first side of the surface of a disc, the disc being of a first conductivity type and the semiconductor structures having at least one trough of a second conductivity type at the surface of the disc.

The disc is joined to a substrate of a second conductivity type, on a second side of the disc, to form a wafer. A trench is produced in the disc at the edge of a power component on the wafer. A terminal region of the second conductivity type is produced on the first side of the disc and a first layer of the second conductivity type is applied on the exposed surface of the trench, so that an electrical contact is produced between the substrate and the terminal region.

A second layer of the second conductivity type is preferably created on the second side of the surface of the disc prior to the connection to the substrate, and the disc is subsequently connected to the substrate via the second layer. The space charge region is consequently formed in the disc and not directly over the boundary layer between the disc and the substrate. If the space charge region were formed around the boundary layer, a higher surface quality or finish would be required, not only in the disc but also in the substrate, which would raise the costs.

In a preferred embodiment of the method, the disc is joined with the substrate into a wafer using the wafer bonding method.

In a preferred embodiment of the method, the first and/or second layer and/or a terminal region is produced by the diffusion of boron, particularly by the diffusion of boroethane.

In another preferred embodiment of the method, the first and/or second layer and/or a terminal region is produced by the implantation of boron. The implantation dose is preferably between $10^{14}/cm^2$ and $10^{16}/cm^2$. A subsequent high-temperature step is necessary for diffusing-in the boron atoms. This preferably occurs at a temperature of between about 1100 to about 1300° C. over a time period of about 10 hours.

The first layer preferably obtains a thickness of at least 3 $\mu$m.

The edge terminations, which adjoin the terminal region, which is electrically connected to the second side of the semiconductor disc, as well as at the base region of the second conductivity type on the first side of the semiconductor disc, are preferably created as field ring structures, or generally as a structure with laterally decreasing doping.

If the individual components are operated independently, the semiconductor is preferably separated into individual chips along the trench, it being possible for the separation to occur by sawing through the middle of the trench.

An advantage of the invention is that, unlike in the realization of an additional edge termination at the anode side (at the collector side), in this arrangement with edge termination at one side, a double-sided photo-technique (which necessarily includes optimally precise passivation and connection steps) is not necessary on the anode side (on the collector side), but instead, all the processing steps in the production of the power component can occur on one side thereof. Furthermore, the isolation diffusion with boron doping is possible given relatively short diffusion times and is thus compatible with IC production.

The power component produced with the inventive method has a reverse blocking ability in addition to a forward blocking ability. Not only is an edge termination for the pn-junction which blocks in the forward direction produced, but also an edge termination for the pn-junction which blocks in the reverse direction is realized on the cathode side (emitter side) of the component.

DESCRIPTION OF THE DRAWINGS

FIG. 1 depicts a portion of a power component produced with the inventive method, in cross-section.

DESCRIPTION OF THE PREFERRED EMBODIMENTS

The power component shown in FIG. 1 has a disc 1 of a first conductivity type. The disc 1 in the example is weakly n-doped and thus is referenced $n^-$ in FIG. 1. The thickness of the disc 1 can be about 300 µm or less. In general, the thickness and the base doping of the weakly doped silicon disc 1 are selected according to the desired blocking voltage of the power component.

On the first side 3 of its surface 2, the disc 1 is provided with semiconductor structures which include at least one trough 10 of a second conductivity type. The upper section of FIG. 1 is referenced below as being at the emitter side or cathode side, with respect to these electrodes, and the lower section of FIG. 1 is referred to as being at the collector side or anode side, accordingly. The method for producing semiconductor structures with at least one trough 10 is generally known and need not be detailed herein.

In a first step of the inventive method, the disc 1 is joined to a substrate 5, which is of a second conductivity type and which is depicted beneath disc 1 in FIG. 1. The substrate can have a thickness of about 400 µm, for example. The disc 1 and the substrate 5 have a common boundary layer 11 after they are joined.

The connection of the disc 1 to the substrate 5 can occur with a "wafer bonding" technique. The process of wafer bonding is generally known in the field of semiconductor production and need not be detailed herein.

The power component according to FIG. 1 has an additional, second layer 8. In the preferred embodiment of the inventive method, the disc 1 is provided with the second layer 8 on the second side 4 of its surface 2 prior to joining the disc 1 to the substrate 5. The second layer 8 created in the disc 1 is of a second conductivity type, which is opposite the first conductivity type of the disc 1. In the given example, the conductivity type of the disc 1 is referenced $n^-$, and the conductivity type of the second layer 8 is referenced p.

Due to the creation of the second layer 8 in the disc 1, the space charge region (not depicted) is formed inside the disc 1 (specifically, at the junction between the $n^-$-region of the disc 1 and the p-region of the second layer) and not directly over the boundary layer 11 between the $n^-$ doped disc 1 and the $p^+$-doped substrate 5. Without the additional layer 8 in the disc 1, given the formation of the space charge region in the vicinity of the boundary layer 11, a high surface quality would be required not only for the disc 1 but also for the substrate 5, as well as an extremely defect-free wafer bonding, which would raise the costs of the material, or of the production method.

The attachment of the disc 1 to the substrate 5 effects a higher mechanical stability of the overall structure and enables the etching of a deep trench 7 in the weakly doped silicon disc 1 without fracturing. The substrate 5, due to its thickness of about 400 µm, acts as a stabilizing carrier. Particularly in the case of a low thickness of the weakly doped silicon discs 1, the carrier 5 additionally greatly facilitates the processing of the silicon discs 1 in the processing sequence, and above all the disc handling in the production of semiconductor components.

The trench 7 is etched into the disc 1 in a next step of the method for the production of the power component. To etch the trench 7 in the disc 1, a mask is placed on the surface of the chip. The mask is structured such that it covers those sections of the chip which should remain unmodified, thus defining the position of the trenches 7 on the surface of the chip.

The trench 7 preferably has a slightly beveled form in cross-section; i.e., in cross-section it represents a trapezoid in which the shorter of the two parallel sides is situated below on the substrate side, and the longer of the two parallel sides is situated above and is open. The shorter parallel side and the two legs of the trapezoid define the exposed surface of the trench 7, which is processed in a further step.

In this further step of the inventive method for the production of a power component, the exposed surface of the trench 7 is doped, so that a layer 6 of the second conductivity type forms on the surface of the trench 7, i.e., in the example of a power semiconductor given in FIG. 1, a p-doped layer 6.

Besides the surface in the trench 7, a terminal region 9 at the edge of the first side 3 of the surface 2 of the disc 1 is also doped in this step, the layer 6 as well as the terminal region 9 being of the second conductivity type. The terminal region 9 contains the edge termination, required for the reverse blocking ability, of the component. This edge termination can be created in the form of field rings, field plates or a "variation of lateral doping" structure, as well as other conventional variants. In the example depicted in FIG. 1, a "variation of lateral doping" structure is depicted as the edge termination. The trough 10 represents the edge termination for the base region, at the cathode side (emitter side), of the power semiconductor, which is required for the forward blocking ability of the component. The central region of the component, which contains the emitter structure, at the cathode side (emitter side), of a thyristor or an IGBT is not depicted in FIG. 1 for clarity.

In the aforementioned second step of the method, the depth of the trench 7 was selected so that an electrical contact between the substrate 5 and the terminal region 9 can be produced via the layer 6, which was created by the doping of the exposed surface of the trench 7. The depth of the trench 7 depends, among other things, on whether an already doped layer 8 is provided in the disc 1. If a layer 8 is not provided in the disc 1, then the depth of the trench 7 is preferably selected such that the substrate 5 under the disc 1 is exposed. Instead, the disc 1 is provided with an already doped layer 8, then the depth of the trench 7 is preferably selected such that a layer of the disc 1 remains, which has a prescribed thickness. The thickness of this residual layer is preferably defined such that the bottom of the trench 7 extends into the layer 8. The layers 6 and 8 are preferably simultaneously diffused in that previously implanted (acceptor) atoms are diffused-in together. The implantation of the layer 8 should occur prior to the wafer bonding, and the implantation of the layer 6 should occur subsequent to the wafer bonding and to the trench etching.

A connection between an electrode situated on the back side of the component and the front side of the component thus is created by the inventive method for the production of a power semiconductor element. In particular, the conductive connection between the reverse-blocking edge termination at the cathode side (emitter side) and the p-emitter at the anode side (collector side) is produced by the overlapping of the doping at the bottom of the trench 7 with the doping of the p$^+$-substrate 5 depicted in FIG. 1, and by the overlapping with the conductive layer 6.

Boron is preferably used as dopant in the doping step of the inventive method.

The boron doping for guaranteeing the conductive connection between the p-emitter at the anode side (collector side) and the reverse-blocking edge termination realized at the cathode side (emitter side) can be realized by means of a masked boron implantation with a subsequent push-in step, for example. An implantation dose between $10^{14}$ and $10^{16}$ boron atoms per cm$^2$ is preferably selected for this purpose. This guarantees against a breakthrough of the space charge region to the surface of the trench. In order to avoid surface influences, the penetration depth of the boron atoms—i.e. the thickness of the layer 6—is preferably at least 3 $\mu$m.

In an alternative embodiment of the method, the boron doping occurs by diffusion, e.g. by boroethane diffusion. To this end, an SiO$_2$ layer is deposited on the chip prior to the boron diffusion, this layer covering the sections of the chip which are not to be diffused. The SiO$_2$ layer is structured such that it exposes, as a mask, the sections on the chip surface which should be boron-diffused.

Subsequent to the production of a wafer with power semiconductor components with the inventive method, individual components can be separated from one another along the trenches. This separation of the individual elements occurs by sawing, for example. The width of the trenches 7 is preferably selected such that the separation of the individual chips is possible without complications, and without damaging the edge system of the individual chips with the first layer 6 and the terminal region 9.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for producing a plurality of vertically-oriented power semiconductor components on a wafer having opposite sides, said power components being disposed on the respective opposite sides of said wafer and being capable of assuming an electrically blocking state on both of said sides of said wafer, said method comprising the steps of:

providing a disc of a first conductivity type having a surface on a first side, and having a second side;

producing a semiconductor structure comprising a power semiconductor component on said surface of said first side of said disc, said semiconductor structure including at least one trough, of a second conductivity type opposite said first conductivity type, in said surface of said first side of said disc;

providing a substrate of said second conductivity type and joining said second side of said disc to said substrate to form a wafer;

producing a trench in said disc at an edge of said power semiconductor component on said wafer;

producing a terminal region of said second conductivity type on said first side of said disc, said terminal region containing an edge termination for a reverse blocking mode of said power semiconductor component; and producing a layer of said second conductivity type on an exposed surface of said trench for producing an electrical contact between said substrate and said terminal region.

2. A method as claimed in claim 1 wherein said layer comprises a first layer, and comprising the additional step of producing a second layer of said second conductivity type on said second side of said disc prior to joining said disc to said substrate, and joining said disc to said substrate via said second layer.

3. A method as claimed in claim 2 wherein the step of producing said second layer comprises producing said second layer by boron diffusion.

4. A method as claimed in claim 2 wherein the step of producing said second layer comprises producing said second layer by implanting boron at said second side of said disc and subsequently tempering said disc.

5. A method as claimed in claim 4 wherein the step of implanting boron comprises implanting boron with an implantation dose between $10^{14}$ cm$^{-2}$ and $10^{16}$ cm$^{-2}$.

6. A method as claimed in claim 1 wherein the step of producing said layer comprises producing said layer by boron diffusion.

7. A method as claimed in claim 6 wherein said layer has a thickness of at least 3 $\mu$m.

8. A method as claimed in claim 1 wherein the step of producing said layer comprises producing said layer by implanting boron at said first side of said disc and subsequently tempering said disc.

9. A method as claimed in claim 8 wherein the step of implanting boron comprises implanting boron with an implantation dose between $10^{14}$ cm$^{-2}$ and $10^{16}$ cm$^{-2}$.

10. A method as claimed in claim 8 wherein said layer has a thickness of at least 3 $\mu$m.

11. A method as claimed in claim 1 wherein the step of producing said terminal region comprises producing said terminal region by boron diffusion.

12. A method as claimed in claim 1 wherein the step of producing said terminal region comprises producing said terminal region by implanting boron at said first side of said disc and subsequently tempering said disc.

13. A method as claimed in claim 12 wherein the step of implanting boron comprises implanting boron with an implantation dose between $10^{14}$ cm$^{-2}$ and $10^{16}$ cm$^{-2}$.

14. A method as claimed in claim 1 wherein the step of producing said terminal region comprises producing said terminal region with a doping which decreases proceeding from said edge.

15. A method as claimed in claim 14 comprising providing said terminal region with field ring structures.

16. A method as claimed in claim 14 comprising providing said terminal region with a laterally, gradually decreasing doping.

17. A method as claimed in claim 1 comprising the additional step of separating said wafer along said trench.

18. A method as claimed in claim 17 wherein the step of separating said wafer comprises sawing said wafer through a middle of said trench.

* * * * *